US009093265B2

(12) United States Patent
Shih et al.

(10) Patent No.: US 9,093,265 B2
(45) Date of Patent: Jul. 28, 2015

(54) HIGH UV CURING EFFICIENCY FOR LOW-K DIELECTRICS

(71) Applicant: Taiwan Semiconductor Manufacturing Co., Ltd., Hsin-Chu (TW)

(72) Inventors: Po-Cheng Shih, Hsin Chiu (TW); Hui-Chun Yang, Hsinchu (TW); Chung-Chi Ko, Nantou (TW); Kuang-Yuan Hsu, Taichung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/053,727

(22) Filed: Oct. 15, 2013

(65) Prior Publication Data

US 2015/0104953 A1   Apr. 16, 2015

(51) Int. Cl.
  *H01L 21/02* (2006.01)
(52) U.S. Cl.
  CPC .................... *H01L 21/02263* (2013.01)
(58) Field of Classification Search
  CPC .......... H01L 21/02274; H01L 21/02203; H01L 21/02216; H01L 21/31695; H01L 21/02348; H01L 21/02277; H01L 21/3105; H01L 21/76801; H01L 21/312; H01L 29/458; H01L 21/02337; H01L 21/02345; H01L 21/76825; H01L 21/76826
  See application file for complete search history.

(56) References Cited

U.S. PATENT DOCUMENTS

| | | | | |
|---|---|---|---|---|
| 6,020,458 A * | 2/2000 | Lee et al. | | 528/401 |
| 6,798,043 B2 * | 9/2004 | Steiner et al. | | 257/637 |
| 7,208,389 B1 * | 4/2007 | Tipton et al. | | 438/409 |
| 7,300,868 B2 * | 11/2007 | Fukasawa et al. | | 438/639 |
| 7,501,354 B2 * | 3/2009 | Ho et al. | | 438/783 |
| 7,622,400 B1 * | 11/2009 | Fox et al. | | 438/784 |
| 8,282,768 B1 * | 10/2012 | Smargiassi et al. | | 156/345.33 |
| 8,454,750 B1 * | 6/2013 | Shrinivasan et al. | | 118/719 |
| 8,481,412 B2 * | 7/2013 | Ko et al. | | 438/514 |
| 8,557,712 B1 * | 10/2013 | Antonelli et al. | | 438/761 |
| 8,629,068 B1 * | 1/2014 | Shrinivasan et al. | | 438/795 |
| 2006/0249078 A1 * | 11/2006 | Nowak et al. | | 118/724 |
| 2006/0251827 A1 * | 11/2006 | Nowak et al. | | 427/558 |
| 2007/0190800 A1 * | 8/2007 | Rantala | | 438/758 |
| 2008/0220619 A1 * | 9/2008 | Matsushita et al. | | 438/795 |
| 2009/0156017 A1 * | 6/2009 | Fukazawa et al. | | 438/788 |
| 2014/0017908 A1 * | 1/2014 | Beynet et al. | | 438/787 |
| 2014/0159244 A1 * | 6/2014 | Lu et al. | | 257/773 |

* cited by examiner

Primary Examiner — Evan Pert
Assistant Examiner — Gustavo Ramallo
(74) Attorney, Agent, or Firm — Eschweiler & Associates, LLC

(57) ABSTRACT

One embodiment is a method for semiconductor processing. In this method, a precursor film is provided over a semiconductor substrate, where the precursor film is made of a structural former and porogen. Prior to cross-linking, the porogen is removed by exposure to UV radiation having one or more wavelengths in the range of 150 nm to 300 nm, while a temperature of 300° C. to 500° C. is applied to the semiconductor substrate. Meanwhile, a Argon:Helium flow rate of 80>Ar>10 slm, 80>He>10 slm is set for the ambient substrate environment where the ratio of Ar:He ranges from 0:1 to 1:0 by volume or molality.

19 Claims, 5 Drawing Sheets

HIGH UV CURING EFFICIENCY FOR LOW-K DIELECTRICS

BACKGROUND

In semiconductor manufacturing, a low-κ dielectric is a material with a small dielectric constant relative to silicon dioxide. Although the proper symbol for the dielectric constant is the Greek letter κ (kappa), in conversation such materials are referred to as being "low-k" (low-kay) rather than "low-κ" (low-kappa). Low-κ dielectric material implementation is one of several strategies used to allow continued scaling of microelectronic devices, colloquially referred to as extending Moore's law. In digital circuits, insulating dielectrics separate the conducting parts (wire interconnects and transistors) from one another. As components have scaled and transistors have got closer together, the insulating dielectrics have thinned to the point where charge build up and crosstalk adversely affect the performance of the device. Replacing the silicon dioxide with a low-K dielectric of the same thickness reduces parasitic capacitance, enabling faster switching speeds and lower heat dissipation.

DETAILED DESCRIPTION

Figure 1A:
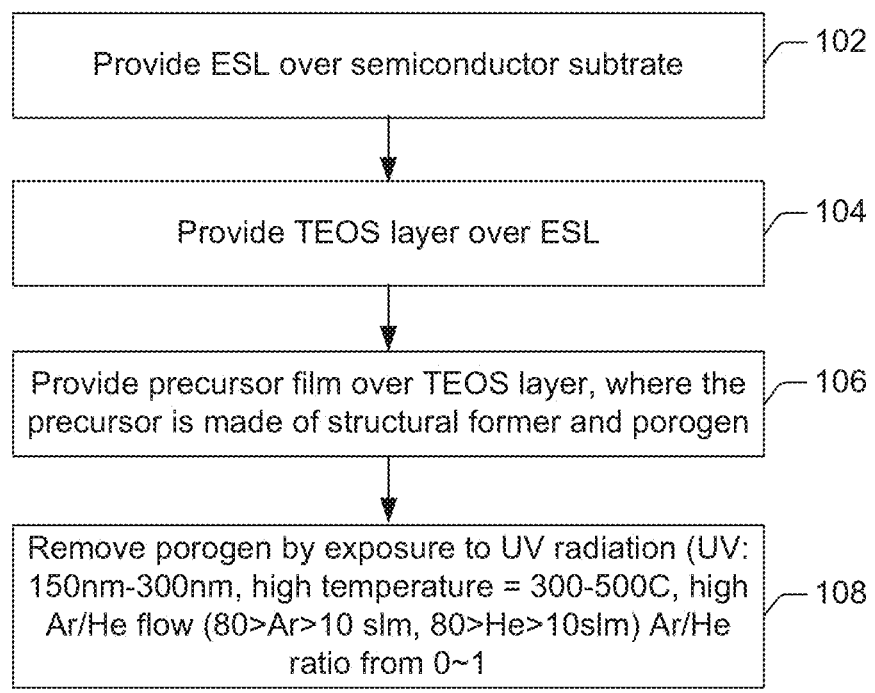
FIG. 1A shows a method to be carried out in the context of a single-station processing apparatus in accordance with some embodiments.

One or more implementations of the present invention will now be described with reference to the attached drawings, wherein like reference numerals are used to refer to like elements throughout. The drawings are not drawn to scale.

There is a general need for materials with low dielectric constants (low-k) in the integrated circuit manufacturing industry. Using low-k materials as the inter-metal dielectric and/or interlayer dielectric of conductive interconnects reduces the delay in signal propagation due to capacitive effects. The lower the dielectric constant of the dielectric, the lower the capacitance of the dielectric and the lower the RC delay of the IC.

Low k dielectrics are conventionally defined as those materials that have a dielectric constant lower than that of silicon dioxide, that is k<4. Typical methods of obtaining low-k materials include doping silicon dioxide with various hydrocarbons or fluorine. These doping methods, however, generally cannot produce materials with dielectric constants lower than about 2.6. With more and more advanced technology needs, present efforts are focused on developing low-k dielectric materials with k less than 2.5. These ultra low-k dielectrics can be obtained by incorporating air voids within a low-k dielectric, creating a porous dielectric material.

Methods of fabricating porous dielectrics typically involve forming a composite film (sometimes referred to as a "precursor film") containing two components: a porogen (typically an organic material such as a polymer) and a structure former or dielectric material (e.g., a silicon containing material). Within the composite film, the structure former acts as a "skeleton" of sorts and the porogen acts as a "flesh" of sorts which establishes bubbles or other open regions within the structure former skeleton. After the composite film (which includes the structure former "skeleton" and the porogen "flesh") is formed on the substrate, the porogen component is removed, leaving a structurally intact porous dielectric matrix. Some conventional techniques for removing porogen from the composite film include, for example, a thermal process in which the substrate is heated to a temperature sufficient for the breakdown and vaporization of the organic porogen, or a UV process. These conventional processes, however, have certain difficulties. In particular, for the thermal processes, substrate temperatures generally need to be high (i.e. greater than about 400 degrees Celsius) with exposure times typically on the order of hours, which can damage copper containing devices. For the conventional UV processes, the resulting low-k dielectric layers can have a significant number of CH2 and CH3 molecules with dangling bonds at an interface thereof. These dangling bonds can cause defects or imperfections in the dielectric layer, which can ultimately increase the dielectric constant of (i.e. worsen) the dielectric layer, and ultimately reduce the breakdown voltage of devices for example.

What are needed therefore are improved methods for removing porogen to form porous films. The present disclosure sets forth several improved techniques to remove porogen from a composite film. Some of these methods are to be carried out in a single-station processing apparatus, while others are carried out in a multi-station processing apparatus. These techniques use UV treatments with particular pressure ranges, temperature ranges, gas flow rate ranges, and/or radiation wavelength ranges to lessen the number of dangling bonds present on the dielectric layer, relative to conventional solutions, thereby improving the resultant dielectric layer.

FIG. 1A shows an embodiment of a methodology to be carried out on a single-station processing apparatus in accordance with some embodiments. It will be appreciated that although this method and other methods disclosed herein each illustrate a number of acts, not all of these acts are necessarily required, and other un-illustrated acts may also be present. Also, the ordering of the acts in some embodiments can vary from what is illustrated in these figures. In addition, the illustrated acts can be further divided into sub-acts in some implementations, while in other implementations some of the illustrated acts can be carried out concurrently with one another.

The method 100 starts at 102 when an etch stop layer (ESL) is provided over a semiconductor substrate. It will be appreciated that "semiconductor substrate" or "workpiece" as referred to herein may comprise any type of semiconductor material including a bulk silicon wafer, a binary compound substrate (e.g., GaAs wafer), a ternary compound substrate (e.g., AlGaAs), or higher order compound wafers, with or without additional insulating or conducting layers formed thereover, among others. Further, the semiconductor substrate can also include non semiconductor materials such as oxide in silicon-on-insulator (SOI), partial SOI substrate, polysilicon, insulator, oxide, metal, amorphous silicon, or organic material, among others. In some embodiments, the semiconductor substrate can also include multiple wafers or dies which are stacked or otherwise adhered together. The semiconductor substrate can include wafers which are cut from a silicon ingot, and/or any other type of semiconductor/non-semiconductor and/or deposited or grown (e.g. epitaxial) layers formed on an underlying substrate.

At 104, a tetraethyl orthosilicate (TEOS) layer is formed over the ESL.

At 106, a precursor film is provided over the TEOS layer. The precursor is made of structural former and porogen.

In 108, UV radiation is applied to the precursor film to remove the porogen. In some embodiments, the UV radiation is narrowband radiation provided with a wavelength between 150 nm-300 nm, but in other embodiments the UV radiation can be more broadband and can include multiple wavelengths between 150 nm-300 nm. The UV radiation is applied in the presence of a high temperature of approximately 300° C. to 500° C. A high-flow rate of Ar/He gas (e.g., 80>Ar>10 slm, 80>He>10 slm) is also set to help limit dangling surface bonds. The molar ratio of Ar:He in this gas flow can vary widely, with the gas being fully Ar in some instances and fully He in other instances, and any ratio by volume or by molarity falling therebetween.

Figure 1B:
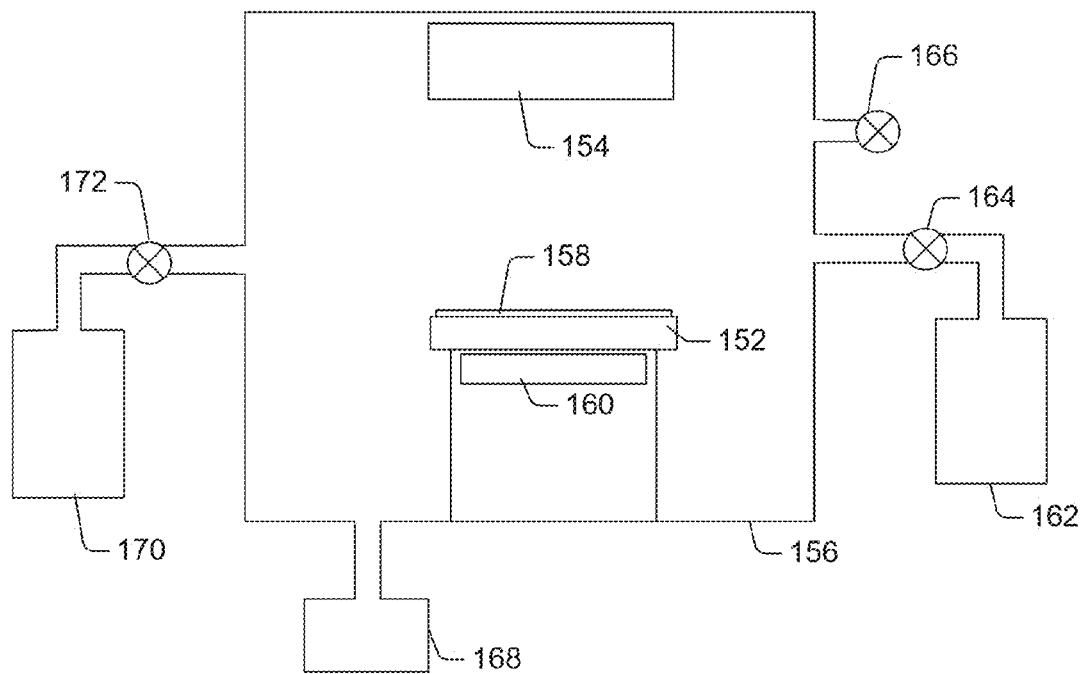
FIG. 1B shows a single-station processing apparatus in accordance with some embodiments.

FIG. 1B is a schematic diagram of an example single-station processing system 150 in accordance with some embodiments, and upon which FIG. 1A's methodology can be carried out. A workpiece chuck 152 and a UV light source 154 are housed within a processing chamber 156. In alternate embodiments, the UV light source 154 may be mounted outside the chamber 156 on a window (not shown). Chamber 156 is capable of holding a vacuum and/or containing gases at pressures above atmospheric pressure. Chamber 156 may be one chamber in a multi-chambered system or it may be a stand-alone apparatus. Workpiece check 152 holds a workpiece 158, such as a silicon wafer or other semiconductor substrate, such that the workpiece 158 can be irradiated with light from UV light source 154. Workpiece chuck 152 has a heater 160 that can heat the substrate 158 to defined temperatures and can be controlled by a temperature controller (not shown).

UV light source 154 can be a xenon lamp or other source of UV radiation. As indicated above, the UV light source 154 may be a lamp or a laser (not shown), such as an excimer laser, capable of providing intense UV light. In cases where a laser is used, various optical elements may be required to direct the UV light toward portions of the workpiece. Methods for directing the laser light at different portions of the substrate at different times will be included as well. In a specific embodiment, the UV source 154 directs UV radiation on the workpiece 158 at an intensity of between about 1 µW/cm$^2$ and 10 W/cm$^2$ in the range of 150 nanometers to 300 nanometers. Notably, the range of between 150 nanometers and 200 nanometers may be particularly well-suited to limit the number of dangling bonds, relative to conventional approaches. The heater 160 can heat the workpiece 158 to 300° C. to 500° C. during processing.

Inert gas source 162, such as an argon or helium gas source, can provide inert gas to chamber 156. The amount of inert gas introduced into chamber 156 is controlled by valve 164 and is measured by pressure gauge 166. During normal operation, chamber 156 is first evacuated using vacuum pump 168, and then the inert gas or other gas is introduced to a certain chamber pressure. For example, to help limit dangling bonds in some instances, high Argon and/or Helium flow rates can be used (e.g., 80 slm>Ar>10 slm; 80>He>10 slm), with the Argon:Helium ratio ranging from 1:0 to 0:1 and any ratios there between. Other inert gases and/or non-inert gases can also be present. Next, while the heater 160 keeps temperature of workpiece 158 at between 300° C. and 500° C., UV light source 154 is turned on and light of wavelength 150 nm to 300 nm is directed onto workpiece 158. If an oxygen containing process is employed, oxygen gas source 170 can provide oxygen to chamber 156 controlled by valve 172.

Note that the apparatus depicted in FIG. 1B is only an example of a suitable apparatus and other apparatuses designed for other methods involved in previous and/or subsequent processes may be used. For example, methods of the invention may be used with a standard PECVD chamber used to deposit the precursor layer if the chamber is equipped with a UV radiation source. Some supercritical fluid chamber systems may also be configured to include a UV radiation source.

Figure 2A:
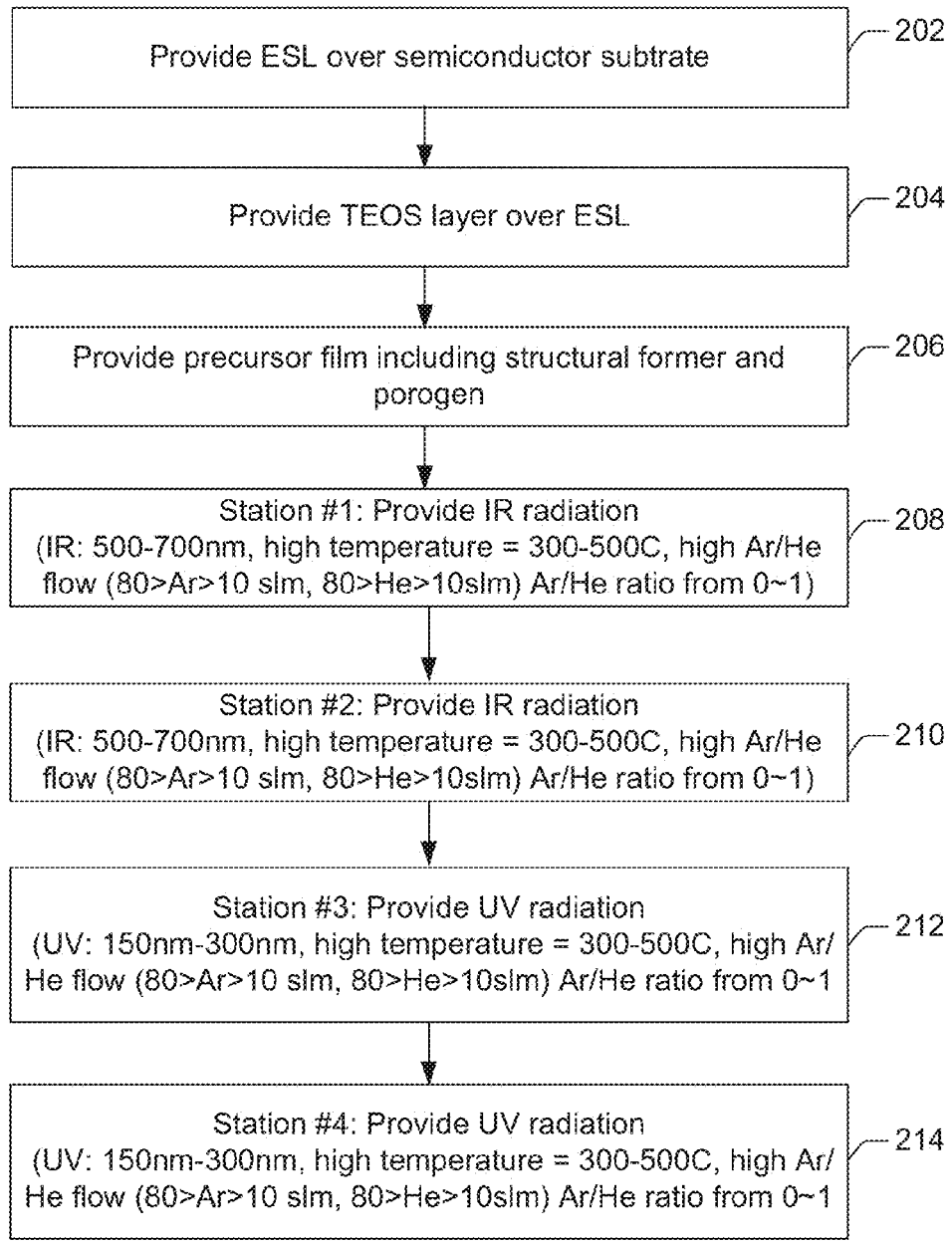
FIG. 2A shows a method to be carried out in the context of a multi-station processing apparatus in accordance with some embodiments.

FIG. 2A depicts another embodiment processing technique 200 in accordance with some embodiments. In contrast to FIG. 1A, which made use of a single-station processing apparatus, the method of FIG. 2A makes use of a multi-station processing apparatus. In the illustrated method 200, the multi-station processing apparatus includes four stations, but it could also include fewer stations (e.g., two or three stations), or additional stations above and beyond those illustrated.

The method 200 starts at 202 when an etch stop layer (ESL) is provided over a semiconductor substrate. At 204, a tetraethyl orthosilicate (TEOS) layer is formed over the ESL.

At 206, a precursor film is provided over the TEOS layer. The precursor is made of structural former and porogen. The structure former serves as a skeleton for the resulting porous low-k film. Many different chemical compositions may be used as the structure former. In some embodiments, the composition of the structure former includes silicon and oxygen. Sometimes it also includes carbon and/or other elements and even metals. For relatively thick precursor layers, it will sometimes be desirable to use structure formers that are translucent or transparent to UV radiation. Examples of precursors for structure formers include silanes, alkylsilanes (e.g., trimethylsilane and tetramethylsilane), alkoxysilanes (e.g., methyltriethoxysilane (MTEOS), methyltrimethoxysilane (MTMOS) diethoxymethylsilane (DEMS), methyldimethoxysilane (MDMOS), trimethylmethoxysilane (TMMOS) and dimethyldimethoxysilane (DMDMOS)), linear siloxanes and cyclic siloxanes (e.g. octamethylcyclotetrasiloxane (OMCTS) and tetramethylcyclotetrasiloxane (TMCTS)). One example of a silane is di-tert-butylsilane.

In 208, the semiconductor substrate is placed on a first station of the multi-stage processing apparatus where IR radiation is applied to the precursor film. The applied IR radiation has a wavelength or wavelengths between 500 nm and 700 nm, while the workpiece is held at a high temperature of 300° C. to 500° C. A high Ar/He flow rate (80>Ar>10 slm, 80>He>10 slm) Ar/He ratio from 0~1) is also used during application of IR radiation.

In 210, after the substrate has undergone processing on the first station, the semiconductor substrate is placed on a second station of the multi-stage processing apparatus. Infra-red (IR) radiation is again applied to the precursor film. The applied IR radiation has a wavelength or wavelengths between 500 nm and 700 nm, while the workpiece is held at a high temperature of 300° C. to 500° C.; where the IR wavelength(s) and temperature used in block 210 can be the same or different from those of 208. A high Ar/He flow rate (80>Ar>10 slm, 80>He>10 slm) Ar/He ratio from 0~1) is also used during application of IR radiation.

In 212, the semiconductor substrate is placed on a third station of the multi-stage processing apparatus where UV radiation is applied to the precursor film. In some embodiments, the UV radiation is narrowband radiation provided with a wavelength between 150 nm-300 nm, but in other embodiments the UV radiation can be more broadband and can include multiple wavelengths between 150 nm-300 nm. The UV radiation is applied in the presence of a high substrate temperature of between 300° C. and 500° C. A high-flow rate of Ar/He gas (e.g., 80>Ar>10 slm, 80>He>10 slm) is also used during application of UV radiation to help limit dangling surface bonds. The molar ratio of Ar:He in this gas flow can vary widely, with the gas being fully Ar in some instances and fully He in other instances, and any ratio by volume or by molarity falling there between.

In 214, the semiconductor substrate is placed on a fourth station of the multi-stage processing apparatus. UV radiation is again applied to the precursor film to facilitate better removal of the porogen, however, the UV radiation used in block 214 can differ in wavelength from the UV radiation used in block 212, although still in the same wavelength range of 150 nm-300 nm. For example, block 212 could use wavelength(s) between 150 nm and 250 nm, while block 214 could use wavelength(s) between 200 nm and 300 nm, although the same wavelengths could be used in other instances. In 214, the UV radiation is applied in the presence of a high temperature, which can differ from the temperature used in 212 in some cases. For example, block 212 could use a temperature between 300° C.-450° C., while block 214 could use a temperature between 350 C-500 C, although the same temperature can be used in other instances. A high-flow rate of Ar/He gas (e.g., 80>Ar>10 slm, 80>He>10 slm) is also set to help limit dangling surface bonds. The molar ratio of Ar:He in this gas flow can vary widely, with the gas being fully Ar in some instances and fully He in other instances, and any ratio by volume or by molarity falling there between. The flow-rate of the Ar/He gas used in block 214 can be the same or different from as used in 212.

Figure 2B:
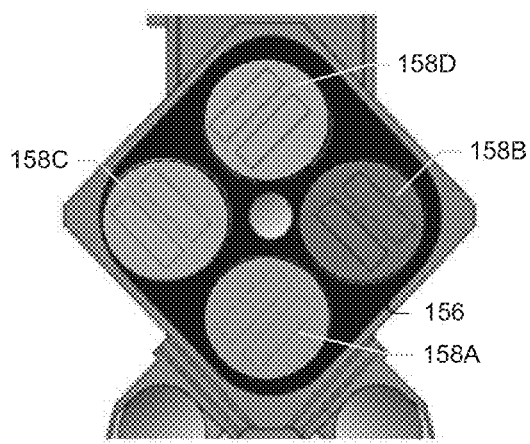
FIG. 2B shows a multi-station processing apparatus in accordance with some embodiments.
Figure 2C:
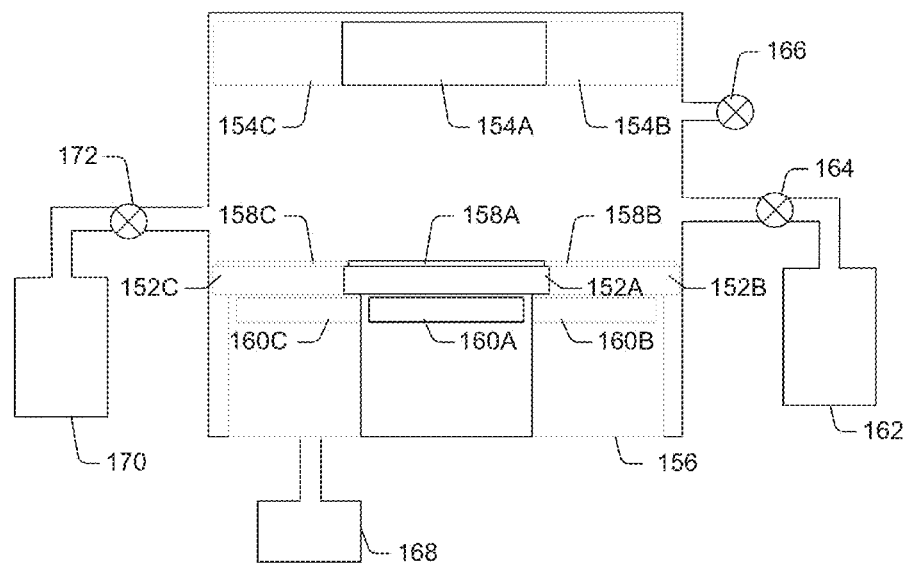
FIG. 2C shows another view of FIG. 2B's multi-station processing apparatus in accordance with some embodiments.

FIGS. 2B-2C show a multi-station process tool 250 to carry out the method of FIG. 2A. The multi-station process tool includes a first station at which a first substrate 158A is mounted on a first workpiece chuck 152A and irradiated by a first IR light source 154A, a second station at which a second substrate 158B is mounted on a second workpiece chuck 152B and irradiated by a second IR light source 154B, a third station at which a third substrate 158C is mounted on a third workpiece chuck 152C and irradiated by a first UV light source 154C, and a fourth station at which a fourth substrate 158D is mounted on a fourth workpiece chuck 152D and irradiated by a second UV light source 154D. Each station can include its own heater (e.g., 160A, 160B, 160C in FIG. 2C). In the illustrated embodiment, the multi-station process tool 250 includes each of the stations within a single chamber 156 with gas supplies as previously described with regards to FIG. 1B, however, in other embodiments each station can have its own process chamber that is separate from the other stations.

Figure 3:
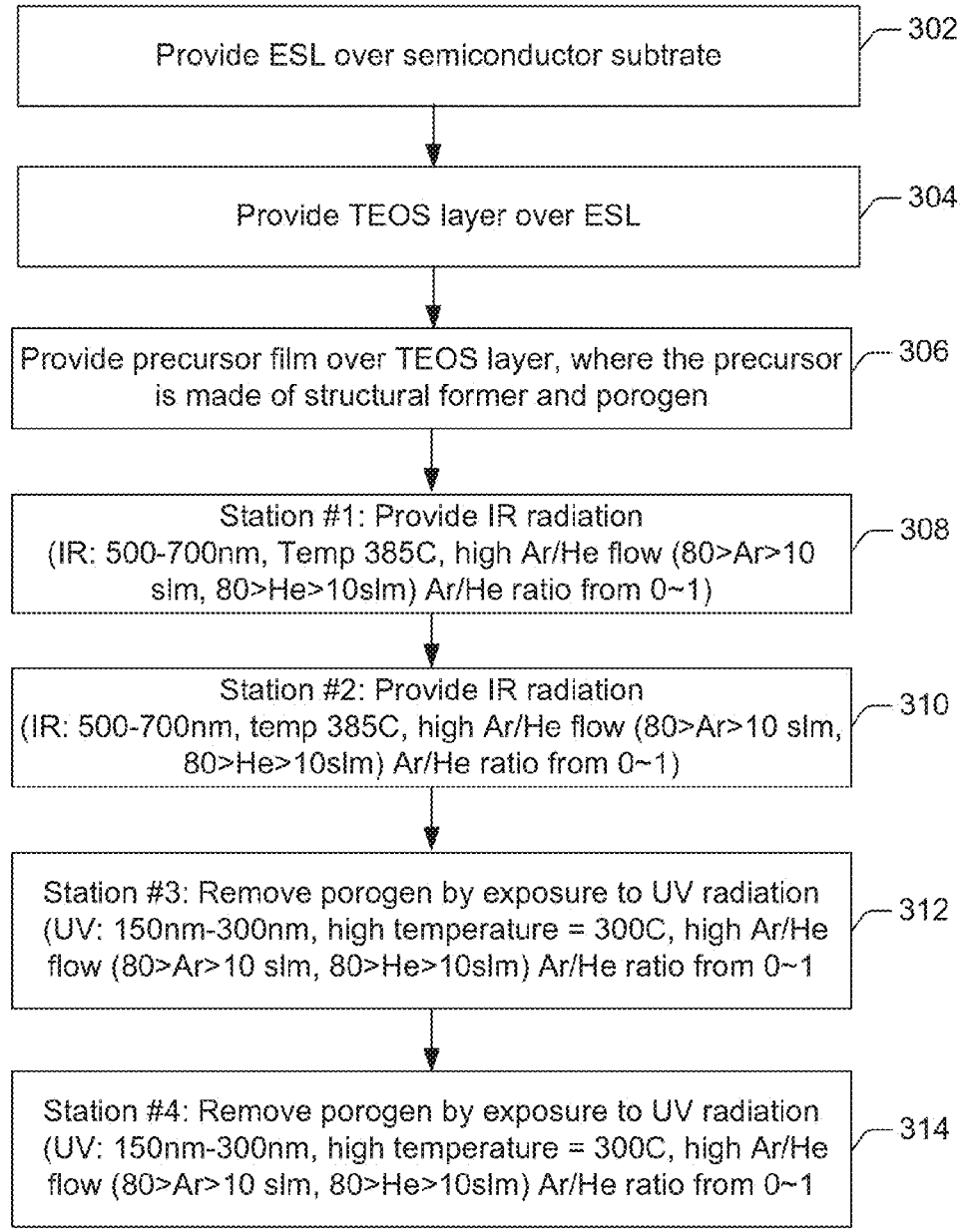
FIG. 3 shows a method to be carried out in the context of a multi-station processing apparatus in accordance with some embodiments.

FIG. 3A depicts another embodiment processing technique 300 in accordance with some embodiments. In contrast to FIG. 2A, which made use of a multi-station processing apparatus with a single temperature range used for porogen removal and cross-linking, the method 300 of FIG. 3A makes use of a multi-station processing apparatus where different temperatures are used for porogen removal and cross-linking. In FIG. 3A's illustrated embodiment, the multi-station processing apparatus includes four stations, but it could also include fewer stations (e.g., two or three stations), or additional stations above and beyond those illustrated.

The method 300 starts at 302 when an etch stop layer (ESL) is provided over a semiconductor substrate. At 304, a tetraethyl orthosilicate (TEOS) layer is formed over the ESL.

At 306, a precursor film is provided over the TEOS layer. The precursor is made of structural former and porogen. The structure former serves as a skeleton for the resulting porous low-k film.

In 308, the semiconductor substrate is placed on a first station of the multi-stage processing apparatus and infra-red (IR) radiation is applied. High Ar/He flow rates are used (80>Ar>10 slm, 80>He>10 slm) Ar/He ratio from 0~1), as is a temperature of approximately 385° C.

In 310, after the substrate has undergone processing on the first station, the semiconductor substrate is placed on a second station of the multi-stage processing apparatus. Infra-red (IR) radiation is again applied. High Ar/He flow rates are again used (80>Ar>10 slm, 80>He>10 slm) Ar/He ratio from 0~1), and a temperature of approximately 385° C. is used for the second station.

In 312, after the substrate has undergone processing on the second station, the semiconductor substrate is placed on a third station of the multi-stage processing apparatus. At the third station, UV radiation is applied to the precursor film to remove the porogen. In some embodiments, the UV radiation is narrowband radiation provided with a wavelength between 150 nm-300 nm, but in other embodiments the UV radiation can be more broadband and can include multiple wavelengths between 150 nm-300 nm. The UV radiation is applied in the presence of a high temperature of approximately 300° C. A high-flow rate of Ar/He gas (e.g., 80>Ar>10 slm, 80>He>10 slm) is also used during application of UV radiation to help limit dangling surface bonds. The molar ratio of Ar:He in this gas flow can vary widely, with the gas being fully Ar in some instances and fully He in other instances, and any ratio by volume or by molarity falling there between.

In 314, after the substrate has undergone processing on the third station, the semiconductor substrate is placed on a fourth station of the multi-stage processing apparatus. UV radiation is again applied to the precursor film to facilitate better removal of the porogen, however, the UV radiation can differ in wavelength from the UV radiation used in block 312, although still in the same wavelength range of 150 nm-300 nm. For example, block 312 could use wavelength(s) between 150 nm and 250 nm, while block 314 could use wavelength(s) between 200 nm and 300 nm. In 314, the UV radiation is applied in the presence of a high temperature of approximately 300° C. A high-flow rate of Ar/He gas (e.g., 80>Ar>10 slm, 80>He>10 slm) is also set to help limit dangling surface bonds. The molar ratio of Ar:He in this gas flow can vary widely, with the gas being fully Ar in some instances and fully He in other instances, and any ratio by volume or by molarity falling there between. The flow-rate of the Ar/He gas used in block 314 can be the same or different from as used in 312.

It will be appreciated that identifiers such as "first" and "second" do not imply any type of ordering, placement, or temporal relationship with respect to other elements; but rather "first" and "second" and other similar identifiers are just generic identifiers and these elements can be swapped in other implementations. Thus, while methods illustrated and described herein may be illustrated and/or described as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A multi-station tool for semiconductor processing and formation of an extreme low-k dielectric, comprising:
a first station where structural former in a precursor film is cross-linked by applying infra-red (IR) radiation having one or more wavelengths of between 500 nm and 700 nm to the precursor film;
a first second station where porogen is removed from the precursor film by exposing the precursor film to ultraviolet (UV) radiation while a substrate on which the precursor film is disposed is kept at a temperature of between 300° C. and 500° C. while an Argon gas flow is set to between 10 slm and 80 slm or while a helium gas flow is set to between 10 slm and 80 slm.

2. The multi-station tool of claim 1, wherein a ratio of argon gas to helium gas (Ar:He) in the flow is set to between (1:0) and (0:1) while the porogen is being removed.

3. The multi-station tool of claim 1, further comprising:
a third station: where porogen further is removed from the precursor film by exposing the precursor film to ultraviolet (UV) radiation while the substrate on which the precursor film is disposed is kept at a temperature of between 300° C. and 500° C. while an Argon gas flow is set to between 10 slm and 80 slm or while a helium gas flow is set to between 10 slm and 80 slm.

4. The multi-station tool of claim 1, where the UV radiation has one or more wavelengths between 150 nm and 300 nm.

5. The multi-station tool of claim 1, where a temperature of approximately 385° C. is applied while the substrate is at the first station during cross-linking.

6. The multi-station tool of claim 5, wherein during the cross-linking, an Argon gas flow is set to between 10 slm and 80 slm or a helium gas flow is set to between 10 slm and 80 slm.

7. The multi-station tool of claim 3, further comprising:
a fourth station on which the substrate is processed prior to the second and third stations, where the structural former in the precursor film is further cross-linked at the fourth station by applying infra-red (IR) radiation having one or more wavelengths of between 500 nm and 700 nm to the precursor film at a temperature of approximately 385° C.

8. A multi-station tool for semiconductor processing and formation of an extreme low-k dielectric, comprising:
a first station: where structural former in a precursor film is cross-linked by applying infra-red (IR) radiation having one or more wavelengths of between 500 nm and 700 nm to the precursor film while a substrate on which the precursor film is disposed is kept at a temperature of approximately 385° C.; and
a second station where porogen is removed from the precursor film by exposing the precursor film to ultraviolet (UV) radiation while the substrate is kept at a temperature of approximately 300° C. while an Argon gas flow is set to between 10 slm and 80 slm or while a helium gas flow is set to between 10 slm and 80 slm.

9. The multi-station tool of claim 8, wherein the first and second stations share a common chamber.

10. The multi-station tool of claim 8, wherein the first and second stations have separate chambers that are hermetically isolated from one another during processing.

11. The multi-station tool of claim 8, further comprising:
a third station: where the porogen is further removed from the precursor film by exposing the precursor film to UV radiation at the third station while the substrate on which the precursor film is disposed is kept at a temperature of approximately 385° C.

12. The multi-station tool of claim 11, wherein an Argon gas flow is set to between 10 slm and 80 slm or where a helium gas flow is set to between 10 slm and 80 slm during processing on the first and third stations.

13. The multi-station tool of claim 11, further comprising:
a fourth station: where the porogen further is removed from the precursor film by exposing the precursor film to UV radiation at the fourth station while the substrate on which the precursor film is disposed is kept at a temperature of approximately 385° C.

14. A method for semiconductor processing, comprising:
providing an etch stop layer over a semiconductor substrate;
providing a tetraethyl orthosilicate (TEOS) layer over the etch stop layer;
providing a precursor film over the TEOS layer, wherein the precursor film includes a structural former and porogen;
removing the porogen from the precursor film in a chamber by exposing the precursor film to ultraviolet (UV) radiation having a wavelength of between 150 nm and 300 nm while an Argon flow of between 10 slm and 80 slm or a Helium flow of between 10 slm and 80 slm is supplied to the chamber.

15. The method of claim 14, wherein the UV radiation has a wavelength of between 150 nm and 200 nm.

16. The method of claim 14, wherein the semiconductor substrate is heated to a temperature of approximately 300° C. while the precursor film is exposed to the UV light.

17. The method of claim 14, further comprising:
cross-linking the structural former in the precursor film by applying infra-red (IR) radiation having one or more wavelengths of between 500 nm and 700 nm to the precursor film.

18. The method of claim 17, wherein the IR radiation is applied while the semiconductor substrate is heated to a temperature of approximately 385° C.

19. The method of claim 17, wherein the IR radiation is applied while an Argon flow of between 10 slm and 80 slm or a Helium flow of between 10 slm and 80 slm is supplied to the chamber.

* * * * *